(12) United States Patent
Tai et al.

(10) Patent No.: US 8,187,939 B2
(45) Date of Patent: May 29, 2012

(54) DIRECT CONTACT IN TRENCH WITH THREE-MASK SHIELD GATE PROCESS

(75) Inventors: Sung-Shan Tai, San Jose, CA (US); Hamza Yilmaz, Saratoga, CA (US); Anup Bhalla, Santa Clara, CA (US); Hong Chang, Cupertino, CA (US); John Chen, Palo Alto, CA (US)

(73) Assignee: Alpha & Omega Semiconductor Incorporated, Sunnyvale, CA (US)

( * ) Notice: Subject to any disclaimer, the term of this patent is extended or adjusted under 35 U.S.C. 154(b) by 105 days.

(21) Appl. No.: 12/565,611

(22) Filed: Sep. 23, 2009

(65) Prior Publication Data

US 2011/0068386 A1   Mar. 24, 2011

(51) Int. Cl.
*H01L 21/336* (2006.01)
*H01L 29/66* (2006.01)
(52) U.S. Cl. ............... 438/270; 257/330; 257/E21.419
(58) Field of Classification Search .............. 438/270, 438/589, 629, 268, 494, 689; 257/328, 330, 257/334, E21.419, E29.256
See application file for complete search history.

(56) References Cited

U.S. PATENT DOCUMENTS

| 6,710,403 | B2 * | 3/2004 | Sapp ..................... 257/330 |
| 7,504,303 | B2 | 3/2009 | Yilmaz |
| 2004/0031987 | A1 * | 2/2004 | Henninger et al. ......... 257/328 |
| 2006/0273386 | A1 | 12/2006 | Yilmaz |
| 2007/0194374 | A1 * | 8/2007 | Bhalla et al. ............ 257/330 |

* cited by examiner

*Primary Examiner* — Thomas L Dickey
*Assistant Examiner* — Nikolay Yushin
(74) *Attorney, Agent, or Firm* — Joshua D. Isenberg; JDI Patent

(57) ABSTRACT

A semiconductor device and a method for making a semiconductor device are disclosed. A trench mask may be applied to a semiconductor substrate, which is etched to form trenches with three different widths. A first conductive material is formed at the bottom of the trenches. A second conductive material is formed over the first conductive material. An insulator layer separates the first and second conductive materials. A first insulator layer is deposited on top of the trenches. A body layer is formed in a top portion of the substrate. A source is formed in the body layer. A second insulator layer is applied on top of the trenches and the source. A contact mask is applied on top of the second insulator layer. Source and gate contacts are formed through the second insulator layer. Source and gate metal are formed on top of the second insulator layer.

33 Claims, 11 Drawing Sheets

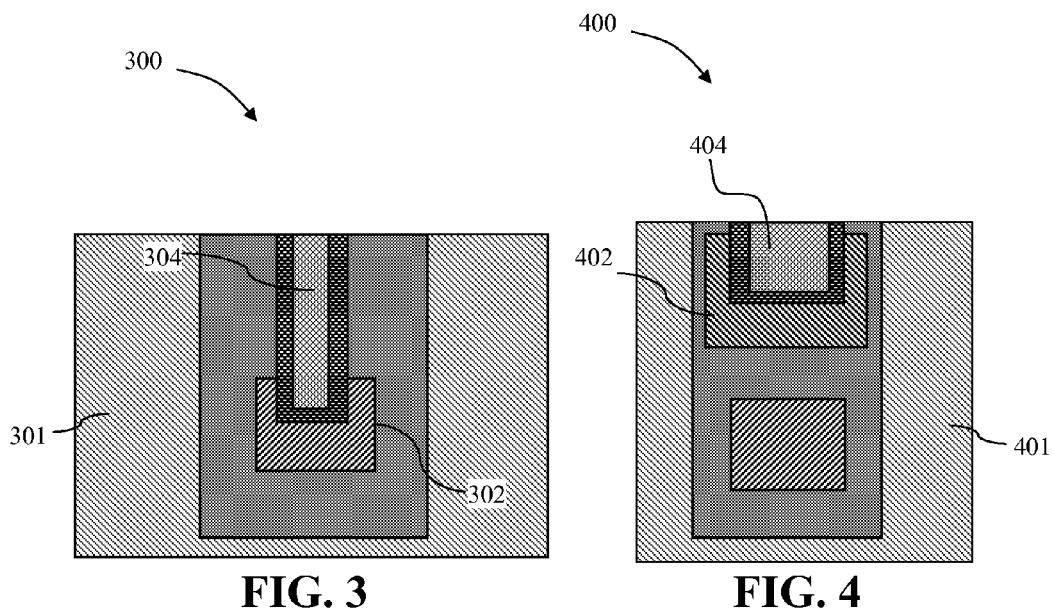
FIG. 3
FIG. 4
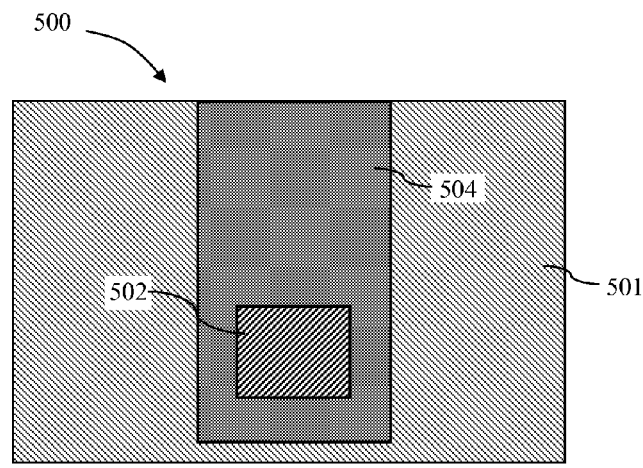
FIG. 5

US 8,187,939 B2

DIRECT CONTACT IN TRENCH WITH THREE-MASK SHIELD GATE PROCESS

FIELD OF THE INVENTION

This invention generally relates to semiconductor devices and more particularly to trench-gate field effect transistors (FET) and method of making the same.

BACKGROUND OF THE INVENTION

A DMOS (Double diffused MOS) transistor is a type of MOSFET (Metal Oxide Semiconductor Field Effect Transistor) that uses two sequential diffusion steps aligned to the same edge to form the channel region of the transistor. DMOS transistors are often high voltage, high current devices, used either as discrete transistors or as components in power integrated circuits. DMOS transistors can provide high current per unit area with a low forward voltage drop.

One particular type of DMOS transistor is a so-called trench DMOS transistor in which the channel is present on the sidewall of a trench, with the gate formed in the trench, which extends from the source towards the drain. The trench, which is lined with a thin oxide layer and filled with polysilicon, allows less constricted current flow than the planar gate DMOS transistor structure and thereby provides lower values of specific on-resistance.

Dual gate trench MOSFETs have been developed and manufactured. US publication No. 2006/0273386 discloses a method of making a shield gate field effect transistor including a body region of a first conductivity type over a semiconductor region of a second conductivity type. A gate trench extends through the body region and terminates within the semiconductor region. At least one conductive shield electrode is disposed in the gate trench. The shield electrode is connected to the source voltage and shields the gate electrode from the drain to reduce the gate-drain capacitance (Cgd) and to improve the breakdown voltage. A gate electrode is disposed in the gate trench over but insulated from the at least one conductive shield electrode. A shield dielectric layer insulates the at lease one conductive shield electrode from the semiconductor region. A gate dielectric layer insulates the gate electrode from the body region. The shield dielectric layer is formed such that it flares out and extends directly under the body region.

However, a conventional method of making such a shield gate field effect transistor requires a six to eight masks process that is expensive and time consuming.

It is within this context that embodiments of the present invention arise.

BRIEF DESCRIPTION OF THE DRAWINGS

Other objects and advantages of the invention will become apparent upon reading the following detailed description and upon reference to the accompanying drawings in which:

FIGS. 2B, 2D, 2F, 2H, 2J, 2M 2P, 2S, 2T, and 2V are a sequence of cross-sectional views taken along line B-B of FIGS. 1A-1B illustrating different stages of the method of making the shield gate field effect transistor depicted in FIGS. 1A-1C.

FIG. 3 is a cross-sectional view illustrating a source poly connection according to an embodiment of the present invention.

FIG. 4 is a cross-sectional view illustrating a gate poly connection according to an embodiment of the present invention.

FIG. 5 is a cross-sectional view of a structure for the source poly in the third direction according to an embodiment of the present invention.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

Embodiments of the present invention illustrating a method of making shield gate trench FET transistors including direct source and gate contacts with a 3 mask shield gate process.

Figure 1A:
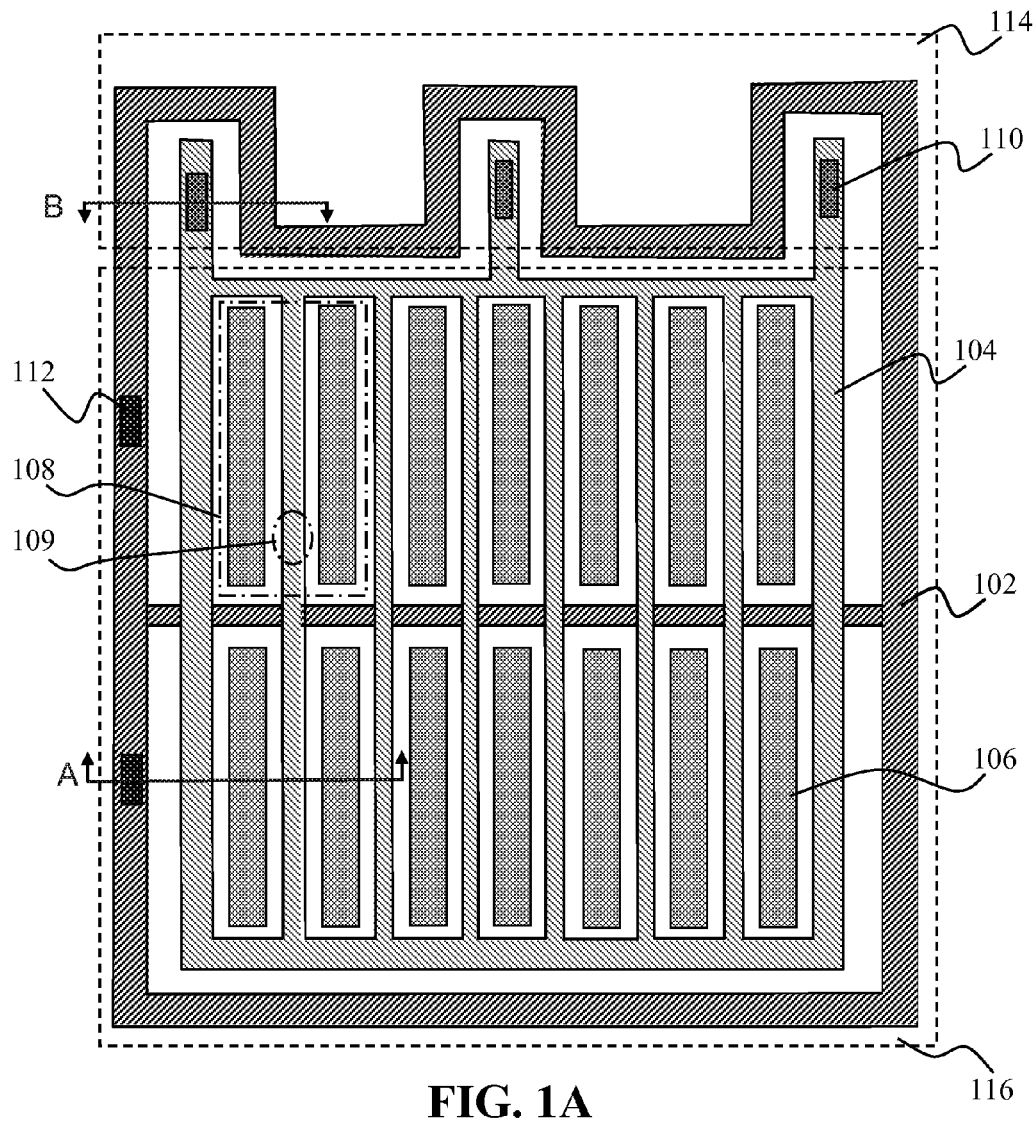
FIGS. 1A and 1B are top views of first and second possible layouts respectively of semiconductor devices according to an embodiment of the present invention.
Figure 1B:
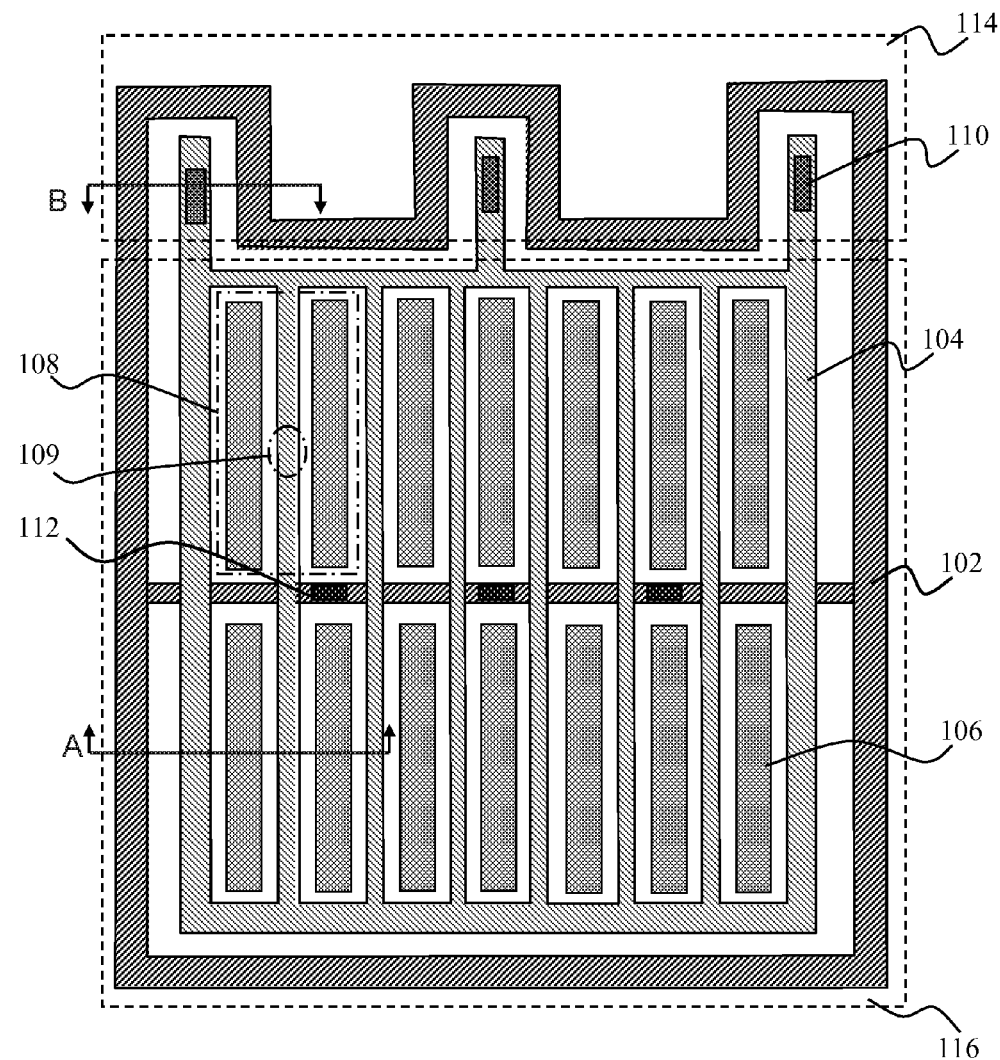

FIGS. 1A-1B are top views illustrating two layouts of semiconductor devices 100 that include a bottom drain shield gate trench FET. As shown in FIG. 1A, the semiconductor device 100 is formed from a semiconductor substrate. The device 100 includes a first trench pattern 102 and a second trench pattern 104. The first trench pattern 102 includes one or more interconnected trenches, each of which contains a source electrode, made of a first conductive material (e.g., a first polysilicon layer referred to as poly1) and electrically coupled to the source voltage. The second trench 104, similarly contains one or more interconnected trenches, each of which contains a gate electrode, made of a second conductive material (e.g., a second polysilicon layer referred to as poly2) in addition to the source electrode. The source electrode, also known as a shield electrode, is formed in the bottom of a trench in the substrate and the gate electrode is formed in the top portion of the trench. The first and second conductive materials may be electrically insulated from the material of the substrate 101 by insulating material on the sidewalls and bottoms of the trenches in the first and second trench patterns 102, 104. Trenches in both the first trench pattern 102 and the second trench pattern 104, which are interconnected together, may contain a source electrode at a bottom of the trench. In addition, trenches in the second trench 104 may also contain a gate electrode in a top portion of the trench which is isolated from the source electrode by an insulating material. It is noted that an outermost portion of the first trench pattern 102 may also act as a guard ring due to the thick insulator between the first conductive material and the material of the substrate 101.

Contacts 110 provide vertical electrical connection from the gate electrode in the second trench pattern 104 to a gate metal 114 located at the top of the semiconductor device. Additional contacts 112 provide vertical electrical connection from the source electrode in the first trench pattern 102 to a source metal 116 also located at the top of the semiconductor device 100. The shield electrode in the first trench pattern 102 is interconnected with the shield electrode in the second trench pattern 104. By way of example, the source metal 116 may be electrically connected to ground, and a drain metal on the bottom side (not shown) may be electrically connected to a high voltage (negative) for N-channel operation—for P-channel operation, the drain metal may be connected to a positive high voltage instead. FIGS. 1A and 1B show different possible locations for the contacts 112. The contacts 112 may be located at an edge of the source metal 116, where the voltage may be high due to the proximity to the die edge, as shown in FIG. 1A. Alternatively, the contacts 112 may be located in the middle of the source metal 116, where the voltage is low, as shown in FIG. 1B.

Figure 1C:
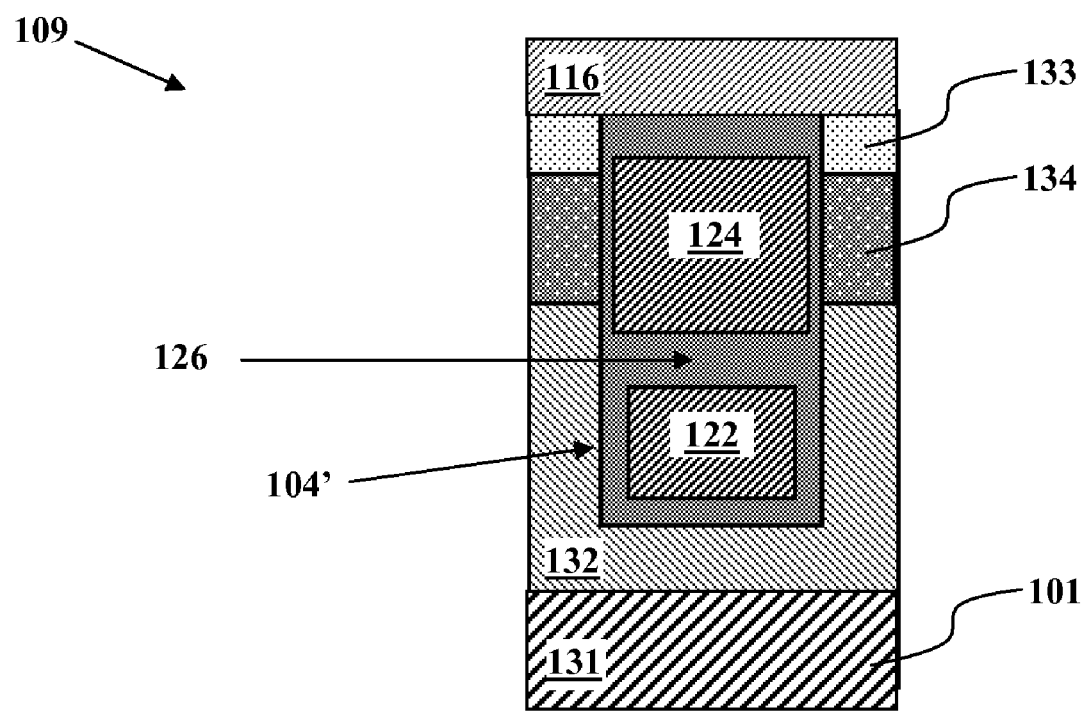
FIG. 1C is a cross-sectional view of a shield gate field effect transistor having polysilicon (poly) source and poly gate formed in a same trench of the semiconductor devices depicted in FIGS. 1A-1B.

The semiconductor device 100 also includes contacts 106 for electrically connecting the source and body regions of cells 108 to the source metal 116. The cells 108 may be shield gate trench FETs. A cross-sectional view of a central portion 109 of a cell 108 is shown in FIG. 1C. The cell 108 may be formed with trenches 104' of the second trench pattern 104. The trenches 104' may be formed in a semiconductor substrate having a heavily doped substrate layer 131 supporting an epitaxial layer 132. The central portion 109 of the cell 108 may include a first conductive material 122 (e.g., poly1) acting as a source/shield electrode at the bottom of a central trench 104'. The first conductive material forms a shield for the gate electrode 124 of cell 108. A second conductive material 124, e.g., poly 2, provides a gate electrode at the top of the cell. The first and second conductive materials are electrically insulated from the substrate 101 and each other by insulating material including, e.g., an inter-poly-oxide (IPO) layer 126. The cell 108 also includes a source region 133 at the top of the epitaxial layer 132, as well as a body region 134 beneath the source region 133. A source metal 116 covers the cell 108.

Figure 2A:
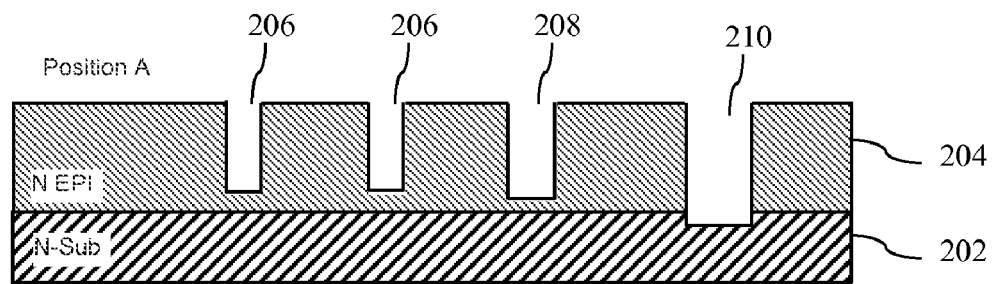
FIGS. 2A, 2C, 2E, 2G, 2I, 2K, 2L, 2N, 2O, 2Q, 2R, 2T, 2U, 2W, 2X, and 2Y are a sequence of cross-sectional views taken along line A-A of FIGS. 1A-1B illustrating different stages of a method of making the shield gate field effect transistor depicted in FIGS. 1A-1C according to an embodiment of the present invention.
Figure 2B:
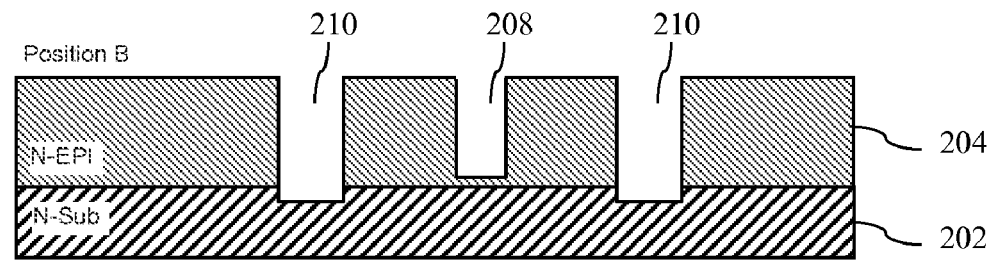
Figure 2C:
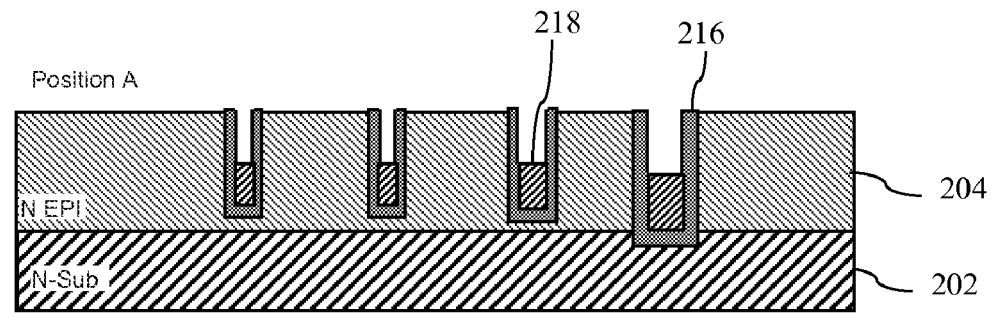
Figure 2D:
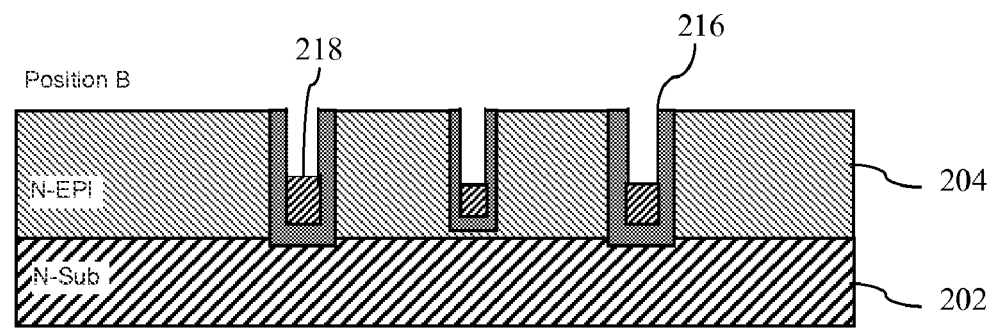
Figure 2E:
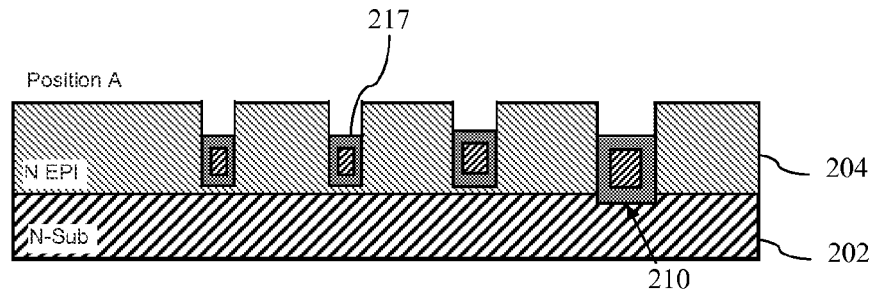
Figure 2F:
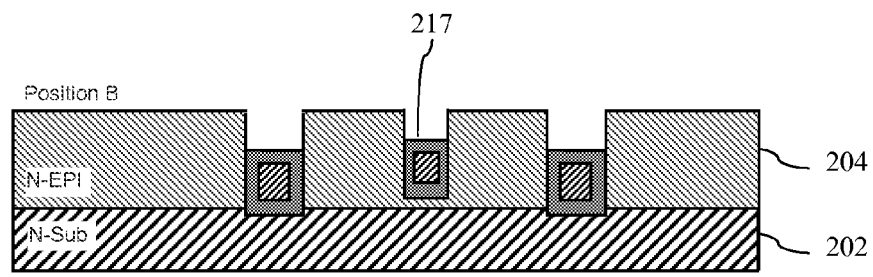
Figure 2G:
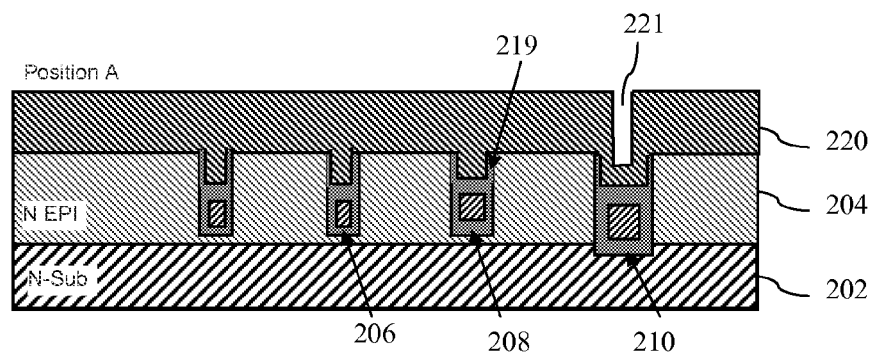
Figure 2H:
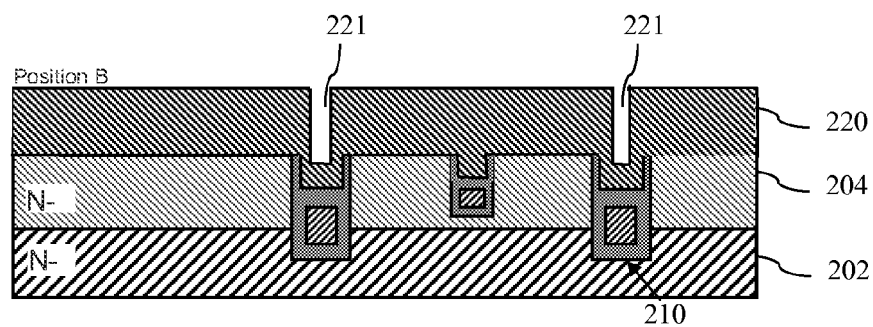
Figure 2I:
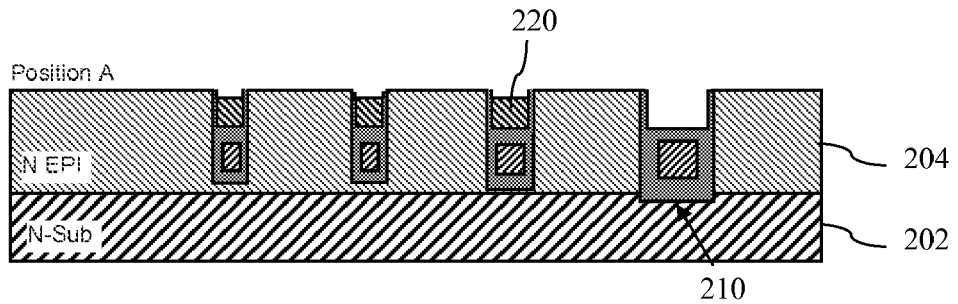
Figure 2J:
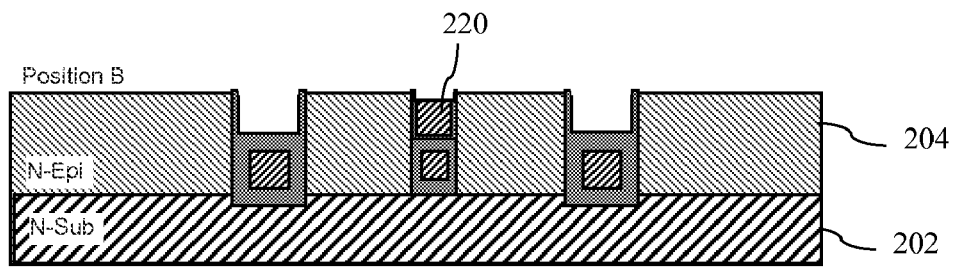
Figure 2K:
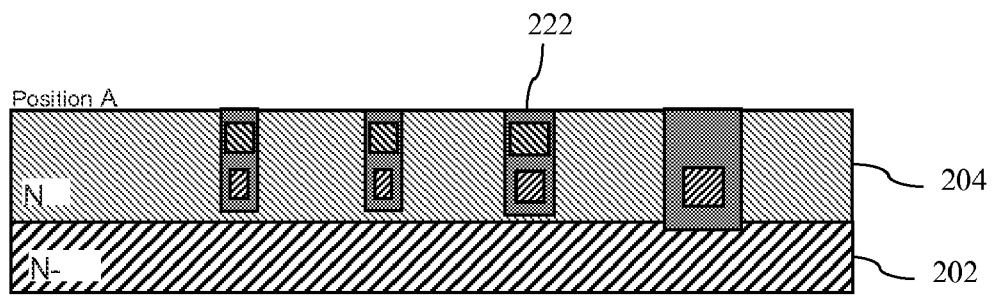
Figure 2L:
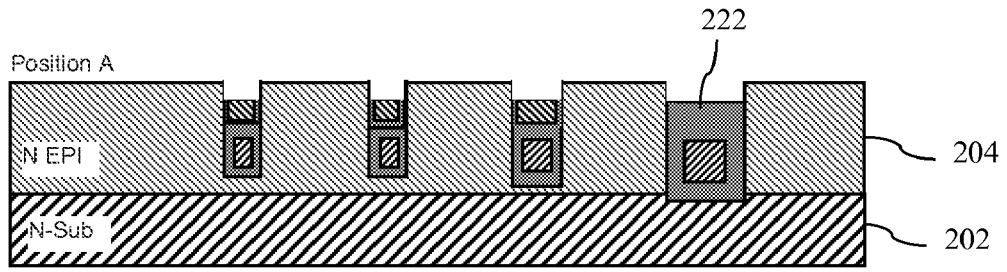
Figure 2M:
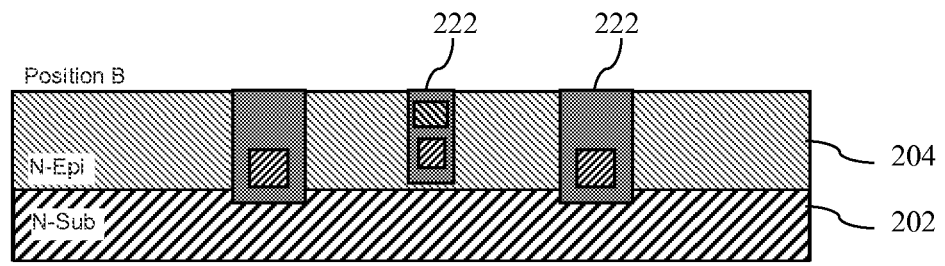
Figure 2N:
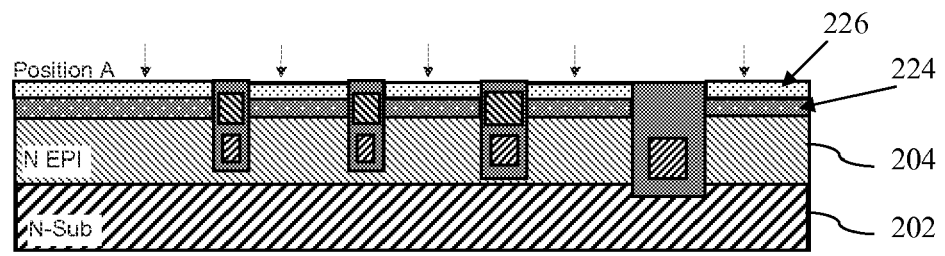
Figure 2O:
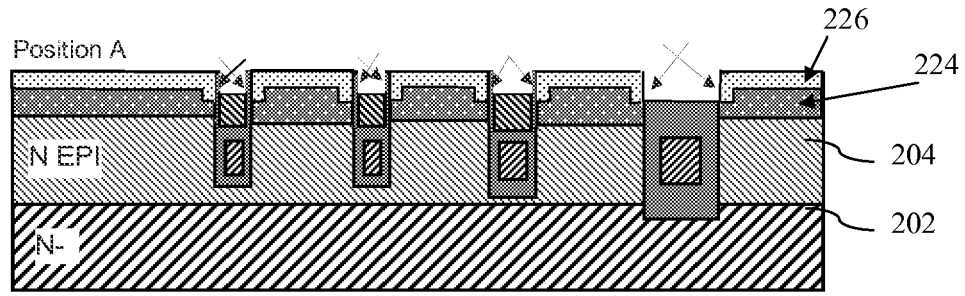
Figure 2P:
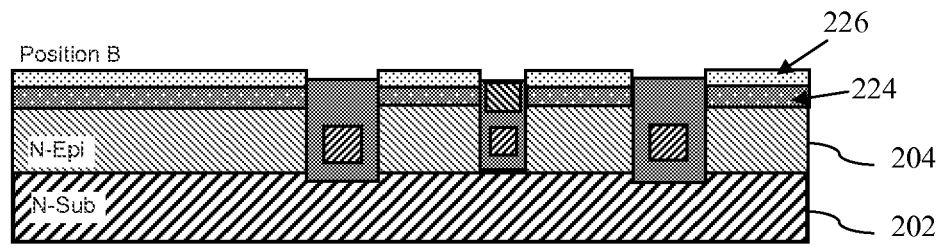
Figure 2Q:
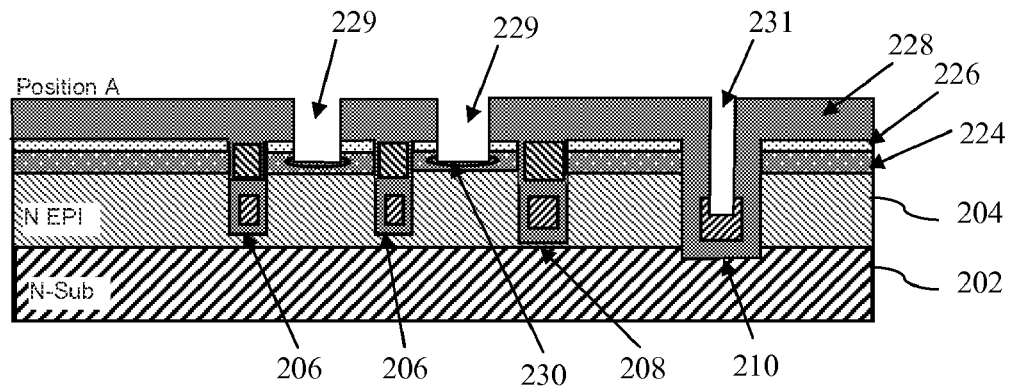
Figure 2R:
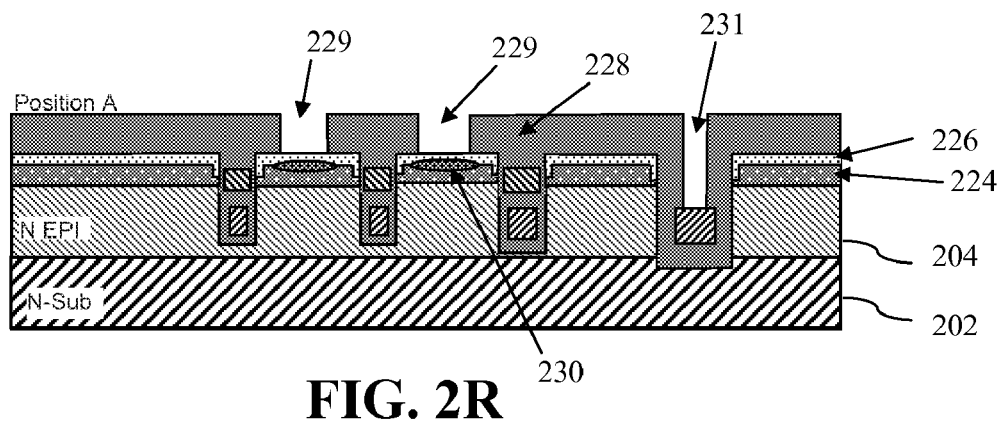
Figure 2S:
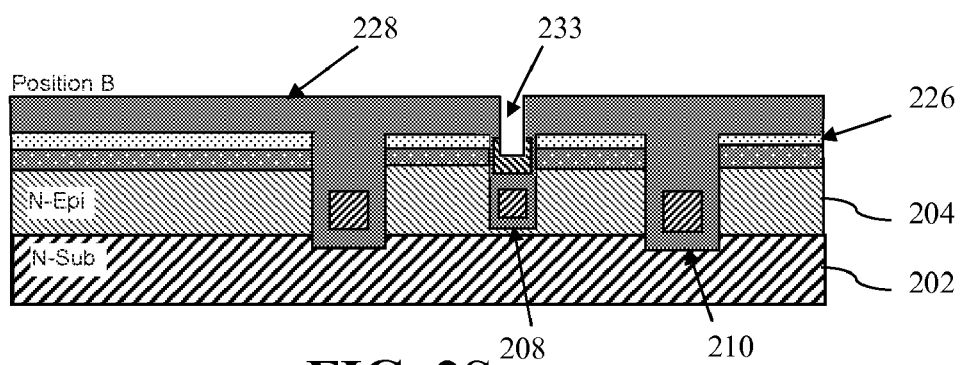
Figure 2T:
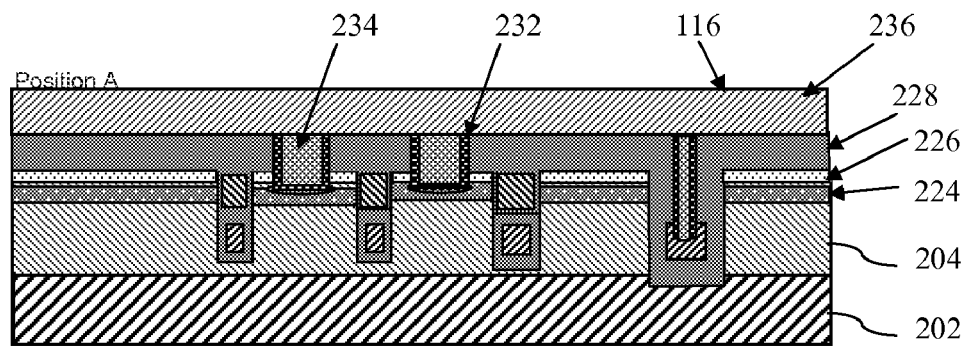
Figure 2U:
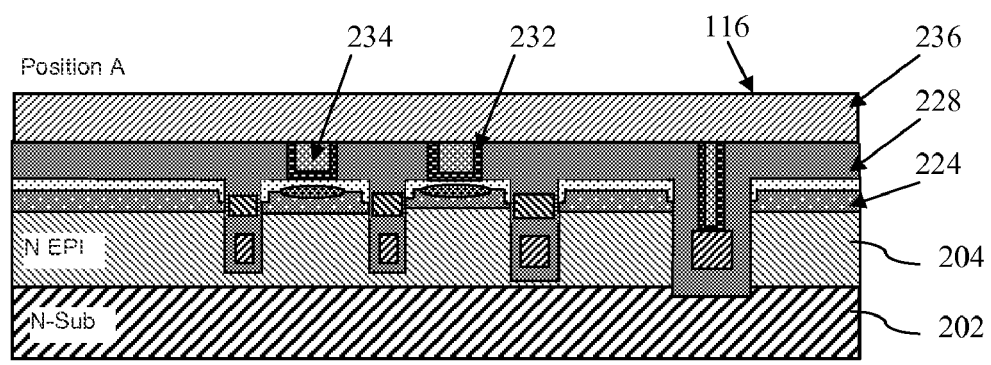
Figure 2V:
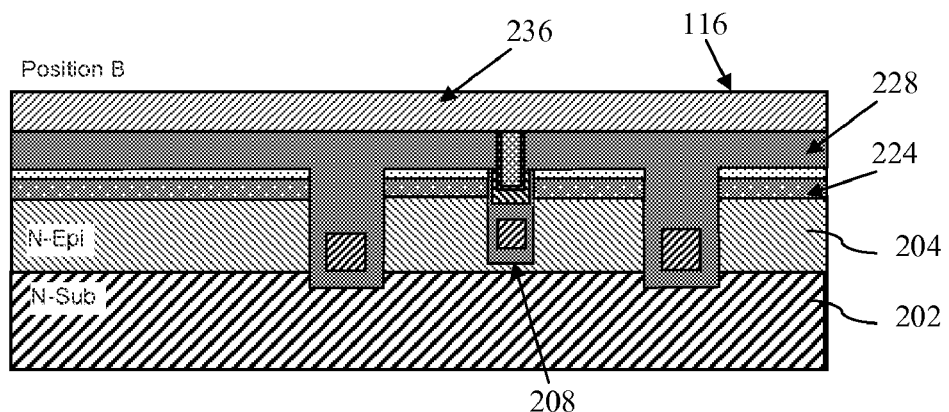
Figure 2W:
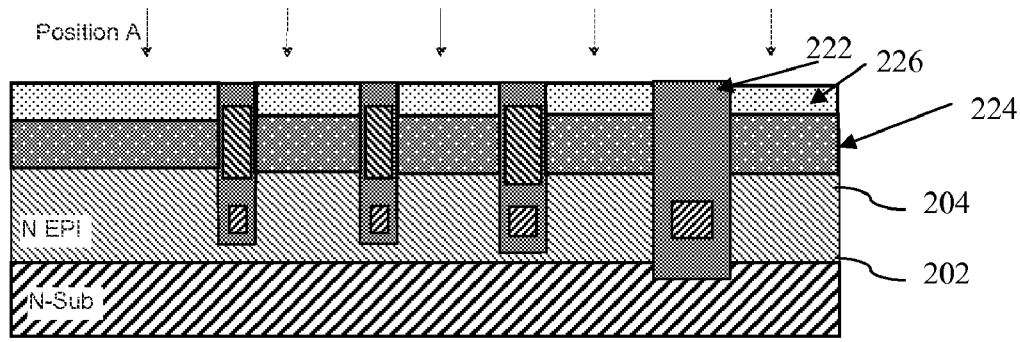
Figure 2X:
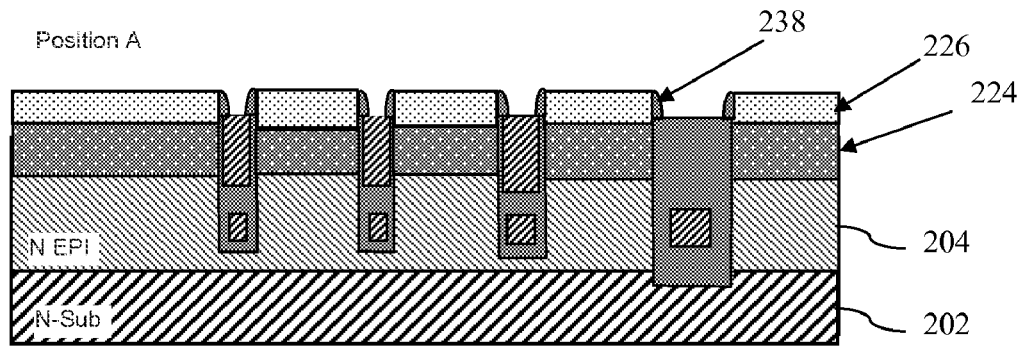
Figure 2Y:
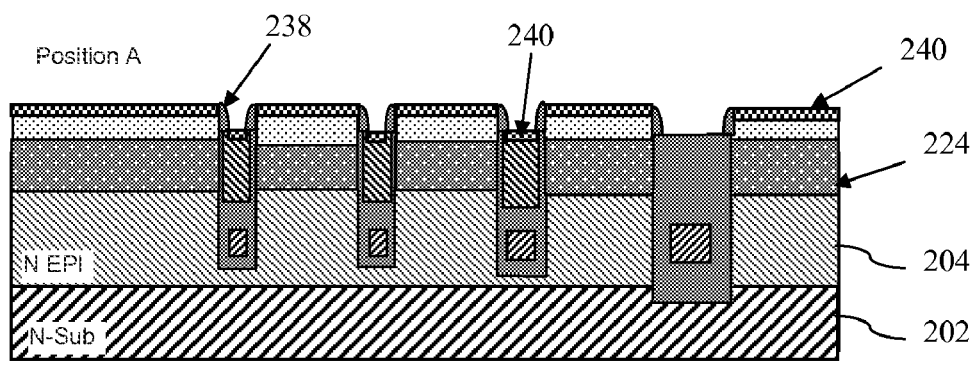

FIGS. 2A-2Y are cross-sectional views illustrating a 3 mask process of making a semiconductor device of the type depicted in FIGS. 1A-1B. Cross-sections taken along lines A and B are respectively marked as "Position A" or "Position B" in FIGS. 2A-2Y.

As shown in FIGS. 2A and 2B, a first mask, e.g., a photomask (not shown) is deposited on top of a semiconductor substrate that includes, e.g., a relatively lightly doped N-EPI layer 204 located on top of a heavily doped N-substrate 202. The first photomask may be patterned with openings that define trenches. Optionally, the photoresist mask may pattern an oxide layer (not shown) over the N-EPI layer 204; the oxide layer may then act as a hard mask for etching the trenches. The N-EPI layer 204 and the N-substrate 202 are then etched through the mask to form trenches 206, 208 and 210, as shown in FIG. 2A, which is along line A. The trenches 206 will form part of the cell 108 later in the process (such as trench 104' of central portion 109 of FIGS. 1A-1C). For convenience these trenches 206 are referred to as cell trenches. Another trench 208 may be used to form part of a trench pattern that connects to a gate metal layer (corresponding to contacts 110 of FIGS. 1A-1B). For convenience this trench 208 is referred to as a gate trench. Yet another trench 210, will form part of a trench pattern that connects to a source metal layer. For convenience this trench 210 is referred to as a source trench (corresponding to contacts 112 of FIGS. 1A-1B). All these trenches are interconnected together, as shown in FIGS. 1A-1B. As shown in FIG. 2B, which is taken along line B, part of the trenches 208 and 210 are formed in a different portion of the substrate. The cell trenches 206 and gate trench 208 may be formed in the N-EPI layer 204, but the source trench 210 can be extended down into the N-substrate 202. The width of the three trenches 206, 208 and 210 are different. For example, the width of the cell trench 206 is the narrowest of the three trenches, e.g., about 0.3 micron to 0.5 micron. The gate trench 208 is wider than the cell trench, e.g., about 0.6 micron to 0.9 micron. The source trench 210 is wider than the gate trench, e.g., about 1.2 microns to 2.0 microns. For a given etch duration, the wider the mask opening, the deeper the trench can be etched by an anisotropic etch process, e.g., dry etch, which is typically used for poly etch back. Since it is desired to make the source trench deeper than the gate trench, the width of the source trench 210 is larger than the depth of the gate trench 208. Preferably, a ratio between the width of the source trench 210 and the width of the trench 208 $W_{trench210}/W_{trench208}$ is about 1.5 to 3 and a ratio of the width of the source trench 210 and the depth of the trench 208 $W_{trench210}/D_{trench208}$ is about 1.1 to 1.3. Thus using a single mask and a single etching step, trenches of varying depths may be formed.

As shown in FIGS. 2C-2D, a thin insulating layer 216 (e.g., an oxide) may be formed on a sidewall and bottom of the trenches 206, 208 and 210. By way of example, the insulating layer 216 may be formed by a combination of thermally grown oxide and high temperature oxide (HTO) deposition. The total thickness of the oxide layer 216 may be about 1500 Angstroms to 2500 Angstroms to block high drain-source voltage $V_{DS}$. A first conductive material 218 (e.g., polysilicon denoted poly1) is then in-situ deposited into the trenches and etched back, for example to about half the depth of the trench.

As shown in FIGS. 2E-2F, a thicker insulating layer 217 is then formed on top of the first conductive material (e.g., poly1, or the source/shield electrode) layer 218. By way of example, and not by way of limitation, the thicker insulating layer 217 may be an oxide formed by high density plasma (HDP) oxide deposition. The insulating layer 217 may then undergo chemical mechanical polish (CMP) and be etched back to a pre-determined thickness on top of the conductive material 218. A wet etch may be used to remove excess insulating material from the sidewalls of the trenches.

As shown in FIGS. 2G-2H, a thin gate insulator 219 (e.g., an oxide) may be formed on the sidewalls of the trenches. The thickness of the gate insulator 219 may be about 250 Å to 1000 Å. A second conductive material layer 220 (e.g., a second polysilicon layer denoted as poly2, or as the gate electrode) may then be deposited to fill the trenches 206 and 208. The amount of the second conductive material may be selected such that the source trench 210 is not completely filled since it is wider and deeper, which leaves a gap 221, e.g., of about 0.1 micron to 0.3 micron in the second conductive material 220 over source trench 210.

As shown in FIGS. 2I-2J, the second conductive material 220 may be isotropically etched back. The conductive material 220 in the source trenches 210 can be removed completely due to the presence of the gap 221, and because wider trench openings etch faster. To minimize the residual amount of conductive material 220 in the source trench 210, the second conductive material 220 in the trenches 206 and 208 may be recessed some degree by a longer isotropic etch process.

A thin insulator layer 222 (e.g., an oxide) may be formed to fill up the trenches 206, 208, 210. By way of example an oxide may be formed by a combination of thermal oxidation and deposition of low temperature oxide or high density plasma (HDP) as shown in FIGS. 2K and 2M. The thin insulator layer 222 may then be chemical mechanical polished and/or etched back. FIG. 2L depicts an alternative version of the process shown in FIG. 2K. In this case, the insulator layer 222 is etched back more to facilitate future angle source implantation.

As shown in FIGS. 2N and 2P, a body layer 224 is formed at a top portion of the N-EPI layer 206 followed by formation of a source layer 226 at a top portion of the body layer 224. The body layer 224 and source layer 226 may be formed, e.g., by vertical implantation and annealing. FIG. 2O illustrates an alternative to the process of FIG. 2N, in which the source 226 may be formed by angled implantation. In this option, the source layer 226 may be implanted thinner, because the angled implants and the removal of oxide 222 over the gate electrode 220 as shown in FIG. 2L, allow the source implant to reach the gate electrode 220 with a small thickness.

FIGS. 2Q-2V illustrate contact formation. As shown in FIGS. 2Q and 2S an insulator layer 228, e.g., a low temperature oxide layer 228, such as borophosphosilicate glass (BPSG), is formed on top of the structure followed by densification. A contact mask (not shown) is formed on the insulator layer 228 and patterned with openings that define contact holes. The contact mask is the second photomask used in this process. The insulator layer 228 and portions of the body layer 224 and source layer 226 may be etched through the openings in the mask to form contact holes 229 and the oxide in the trenches 208 and 210 is etched down to the poly1 or poly2 layer to form holes 231 and 233. First, an oxide etch may be performed to etch away the oxide layer 228 and the oxide in the trenches (e.g., 222) up to the silicon or polysilicon. Then a silicon etch is performed to etch through the source layer 226 and expose the body layer 224 in contact holes 229. FIG. 2R is an alternative version of the step of FIG. 2Q. In this version, the etching to form contact holes 229 ends at the top surface of the body layer 224. Then, standard processes of body contact implant and diffusion may be carried out to form a body contact region 230 proximate the bottom of the contact holes 229. The source/shield electrodes 218 and gate electrodes 220 are heavily doped and so are not affected by the body contact implant.

Due to the depth of the source/shield electrode 218 in trench 210, the size of the contact hole 231 may be larger than the size of the contact hole 233 or 229. For example, the size of the contact hole 231 may be about 0.25 micron to 0.35 micron versus the size of the contact hole 233 being about 0.35 micron to 0.7 micron.

As shown in FIGS. 2T-2V, a layer 232 of a barrier material, such as Ti/TiN, may be deposited into the contact holes 229, 231 and 233. A conductive (e.g., tungsten (W)) plug 234 may then be used to fill up the contact holes 229, 231 and 233. The barrier metal 232 and tungsten plug 234 in the contact holes 229 over the source regions 226 provide source/body contacts. A metal layer 236, preferably Al-Si, may then be deposited on top of the resulting structure. A patterned metal mask (not shown) is deposited on the metal layer 236 following with a metal etch to separate the metal layer 236 into electrically isolated portions that form gate and source metals such as gate metal 114 and source metal 116 of the semiconductor device 100 of FIGS. 1A-1B to complete the device. The metal mask is the third photomask in this process. The barrier metal 232 and tungsten plug 234 in the contact holes 229 over the source regions provide source/body contacts 106 from the source layer 226 and body layer 224 to the source metal 116 (FIGS. 1A-1B). The barrier metal 232 and tungsten plug 234 in the contact holes 231 over the source trench 210 provide vertical source trench contacts 112 from the source electrode 218 to the source metal 116 (FIGS. 1A-1B). The barrier metal 232 and tungsten plug 234 in the contact holes 233 over the gate trenches 208 provide vertical gate trench contacts 110 from the gate electrode 220 to the gate metal 114, (FIGS. 1A-1B). Optionally, an additional mask for passivation may used subsequently. A drain metal (not shown) may then be formed on the bottom of the device, a standard process which does not require a mask.

FIG. 2W is the same step as FIG. 2N and FIGS. 2X-2Y illustrate an optional salicidation of silicon material that may be performed right after source implant and drive-in, i.e., right after steps illustrated in FIG. 2N or FIG. 2W, if needed. In this case, the insulating layer 222 is etched back to form oxide spacers 238 as shown in FIG. 2X. For example if the insulating layer 222 in the trench over the second conductive material 220 (e.g., poly2) is an oxide about 1200 Angstroms to 2000 Angstroms thick, a dry etch may be used. The sidewall spacer thickness is preferably about 500 Angstrom to 800 Angstroms. The spacer prevents source layer 226 and second conductive material (gate electrode) 220 from shorting. If the second conductive material 220 is polysilicon, salicide 240 may then be formed with a standard salicidation process on top of the second conductive material 220 and on top of the source layer 226 as shown in FIG. 2Y. The salicidation process includes the deposition of Ti/TiN, rapid thermal annealing (RTA) at a temperature of 580 C. to 680 C. in nitrogen atmosphere, which forms salicide 220 wherever the Ti/TiN contacts silicon or polysilicon, followed by the stripping of the remaining TiN. The metal salicide may be TiSi, NiSi or CoSi. TiSi may optionally be used to reduce the gate resistance. Ti/TiN will not react with oxide to form salicide, so the oxide spacers 238 remain free of salicide.

Subsequent contact and metal formation may be implemented as described in FIGS. 2Q-2V after the salicide formation.

FIGS. 3-5 illustrate some examples of different types of trench structures found in the devices described above. For simplicity FIGS. 3-5 omit details such as source and body regions, BPSG, etc. FIG. 3 is a cross-sectional view illustrating a structure 300 of the source poly connection and termination, which is formed in the step described in FIG. 2T. As shown in this figure, a polysilicon source/shield electrode 302 formed in an insulated trench in a semiconductor substrate 301 may be vertically connected directly to the source metal (not shown) by a W-plug contact 304. FIG. 4 is a cross-sectional view illustrating a structure 400 of a gate poly connection, which may be formed as described in FIG. 2V. As shown in FIG. 4, a polysilicon gate electrode 402 formed in an insulated trench in a semiconductor substrate 401 may be vertically connected directly to the gate metal (not shown) by a W-plug contact 404. In a conventional method, polysilicon source/shield and gate electrodes are connected to the source metal and gate metal respectively.

FIG. 5 is a cross-sectional view illustrating a structure 500 of a portion of a source trench, which may be formed during the course of the process described above with respect to FIGS. 2A-2Y. As shown in FIG. 5, a conductive portion 502 of the trench structure 500 may be formed by depositing polysilicon, e.g., poly1, in a partially oxide filled trench, e.g., a source trench 210 in a semiconductor substrate 501. The rest of the trench may then be filled up with an insulator 504, such as an oxide. FIG. 5 is similar to FIG. 3, but it is located in a region of a trench pattern that does not have a source electrode contact formed. By way of example, the structure depicted in FIG. 3 and FIG. 5 may correspond to an outermost trench of the first trench pattern 102 of FIG. 1A. This outermost trench may act as both a termination trench/guard ring to block against high voltages at the die edge with its thick oxide sidewalls, and also as a contact area for the source metal 116 to contact the source electrode 302, 502 in the trench through contacts 112, 304

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A method for making a shield gate trench semiconductor device, comprising:
    a) applying a trench mask as a first mask to a semiconductor substrate;
    b) etching the semiconductor substrate to form trenches TR1, TR2 and TR3 with three widths W1, W2 and W3, respectively, wherein the trench TR3 is widest and deepest and the width W3 of the trench TR3 depends on a depth D2 of the trench TR2;
    c) forming first conductive material at the bottom of the trenches TR1, TR2 and TR3 to form a source electrode;
    d) forming a second conductive material over the first conductive material in the trenches TR1 and TR2 to form a gate electrode, wherein the first and second conductive materials are separated from each other and from the semiconductor substrate by an insulator material;
    forming a dielectric layer on top of the source electrode in the trenches TR1, TR2 and TR3;
    chemical mechanical polishing and/or etching back the dielectric layer to a pre-determined thickness to form the inter-poly-dielectric layer;
    growing gate oxide on sidewalls of exposed portions of the trenches TR1, TR2 and TR3; and
    depositing the second conductive material into the trenches TR1, TR2 and TR3 to a pre-determined thickness to fill up the trenches TR1 and TR2 but does not fill completely the trench TR3;
    e) depositing a first insulator layer on top of the trenches TR1, TR2 and TR3, wherein a top portion of the trench TR3 is filled up with the insulator;
    f) forming a body layer in a top portion of the substrate;
    g) forming a source layer in a top portion of the body layer;
    h) applying a second insulator layer on top of the trenches TR1, TR2 and TR3 and the source;
    i) applying a contact mask as a second mask on top of the second insulator layer;
    j) forming a source electrode contact in trench TR3, a gate electrode contact in trench TR2, and a source/body contact to the semiconductor substrate; and
    k) applying a metal mask as a third mask and forming source metal and gate metal on top of the second insulator layer.

2. The method of claim 1 wherein the gate oxide has a thickness in a range from 250 Angstroms to 1000 Angstroms.

3. The method of claim 1 wherein the width W3 and the second conductive material is deposited in an amount selected such that there is a gap in the second conductive material deposited in the trench TR3.

4. The method of claim 3 wherein the gap is about 0.1 micron to 0.3 micron.

5. The method of claim 1, further comprising after g) and before h):
    etching back the first insulator layer in the trenches TR1, TR2 and TR3 to form spacers; and
    forming salicide on top of the second conductive material in the trenches TR1 and TR2 and on top of the source layer.

6. The method of claim 1 wherein k) comprises:
    depositing a metal layer on top of the second insulator layer;
    applying a metal mask as the third mask on top of the metal layer; and
    etching the metal layer to form the gate metal and the source metal through the metal mask.

7. The method of claim 1, wherein a) comprises:
    depositing an oxide layer on top of the semiconductor substrate; and
    patterning the oxide layer with the first mask to form a hard mask.

8. The method of claim 1 wherein the W1 is about 0.3 micron to 0.5 micron; W2 is about 0.6 micron to 0.9 micron; and W3 is about 1.2 microns to 2.0 microns.

9. The method of claim 1, wherein a ratio W3/W2 is about 1.5 to 3.

10. The method of claim 1, wherein a ratio W3/D2 is about 1.1 to 1.3.

11. The method of claim 3, further comprising after d) and before e):
    isotropically etching the second conductive material in the trenches TR1, TR2 and TR3 such that the second conductive material in the trench TR3 is completely removed, but wherein a portion of the second conductive material remains in the trenches TR1 and TR2.

12. The method of claim 11 wherein the second conductive material in the trenches TR1 and TR2 are recessed some degree to minimize a residue of the second conductive material in the trench TR3.

13. The method of claim 1 wherein c) comprises:
    forming an oxide layer on sidewall of the trenches TR1, TR2 and TR3;
    in-situ depositing the first conductive material into the trenches TR1, TR2 and TR3; and
    etching back the first conductive material.

14. The method of claim 13 wherein a thickness of the oxide layer is about 1500 Angstroms to 2500 Angstroms.

15. The method of claim 1 wherein j) comprises:
    selectively etching portions of the second insulator layer to form a source electrode contact hole and a gate electrode contact hole and a source/body contact hole;
    depositing a barrier material on sidewall of the source electrode contact hole and gate electrode contact hole and source/body contact hole; and
    filling up remaining portions of the source electrode contact hole and gate electrode contact hole and source/body contact hole with a conductive plug.

16. The method of claim 15, wherein the source electrode contact hole is larger than the gate electrode contact hole.

17. The method of claim 16, wherein the source electrode contact hole is about 0.35 micron to 0.7 micron in width and the gate electrode contact hole is about 0.25 micron to 0.35 micron in width.

18. A method for making a shield gate trench semiconductor device, comprising:
    a) applying a trench mask as a first mask to a semiconductor substrate;

b) etching the semiconductor substrate to form trenches TR1, TR2 and TR3 with three widths W1, W2 and W3, respectively, wherein the trench TR3 is widest and deepest and the width W3 of the trench TR3 depends on a depth D2 of the trench TR2;

c) forming first conductive material at the bottom of the trenches TR1, TR2 and TR3 to form a source electrode;

d) forming a second conductive material over the first conductive material in the trenches TR1 and TR2 to form a gate electrode, wherein the first and second conductive materials are separated from each other and from the semiconductor substrate by an insulator material;

e) depositing a first insulator layer on top of the trenches TR1, TR2 and TR3, wherein a top portion of the trench TR3 is filled up with the insulator;

f) forming a body layer in a top portion of the substrate;

g) forming a source layer in a top portion of the body layer;

h) applying a second insulator layer on top of the trenches TR1, TR2 and TR3 and the source;

i) applying a contact mask as a second mask on top of the second insulator layer;

j) forming a source electrode contact in trench TR3, a gate electrode contact in trench TR2, and a source/body contact to the semiconductor substrate; and k) applying a metal mask as a third mask and forming source metal and gate metal on top of the second insulator layer;

further comprising, after e) and before f) selectively removing a portion of the first insulator layer to a level same as a top surface of the substrate.

19. The method of claim 18 wherein forming a body layer comprises vertical implantation and annealing.

20. The method of claim 18 wherein forming the source layer comprises vertical implantation and annealing.

21. The method of claim 18 wherein k) comprises:
depositing a metal layer on top of the second insulator layer;
applying a metal mask as the third mask on top of the metal layer; and
etching the metal layer to form the gate metal and the source metal through the metal mask.

22. The method of claim 18, wherein a) comprises:
depositing an oxide layer on top of the semiconductor substrate; and
patterning the oxide layer with the first mask to form a hard mask.

23. The method of claim 18 wherein the W1 is about 0.3 micron to 0.5 micron; W2 is about 0.6 micron to 0.9 micron; and W3 is about 1.2 microns to 2.0 microns.

24. The method of claim 18, wherein a ratio W3/W2 is about 1.5 to 3.

25. The method of claim 18, wherein a ratio W3/D2 is about 1.1 to 1.3.

26. The method of claim 18, further comprising after g) and before h):
etching back the first insulator layer in the trenches TR1, TR2 and TR3 to form spacers; and
forming salicide on top of the second conductive material in the trenches TR1 and TR2 and on top of the source layer.

27. The method of claim 18 wherein the first insulator layer is further recessed below the top surface of the substrate.

28. The method of claim 27, wherein forming the source layer comprises angled implantation and annealing.

29. The method of claim 15 wherein c) comprises:
forming an oxide layer on sidewall of the trenches TR1, TR2 and TR3;
in-situ depositing the first conductive material into the trenches TR1, TR2 and TR3; and
etching back the first conductive material.

30. The method of claim 29 wherein a thickness of the oxide layer is about 1500 Angstroms to 2500 Angstrom.

31. The method of claim 18 wherein j) comprises:
selectively etching portions of the second insulator layer to form a source electrode contact hole and a gate electrode contact hole and a source/body contact hole;
depositing a barrier material on sidewall of the source electrode contact hole and gate electrode contact hole and source/body contact hole; and
filling up remaining portions of the source electrode contact hole and gate electrode contact hole and source/body contact hole with a conductive plug.

32. The method of claim 31, wherein the source electrode contact hole is larger than the gate electrode contact hole.

33. The method of claim 32, wherein the source electrode contact hole is about 0.35 micron to 0.7 micron in width and the gate electrode contact hole is about 0.25 micron to 0.35 micron in width.

* * * * *